United States Patent
Yamaoka et al.

(10) Patent No.: US 6,795,332 B2
(45) Date of Patent: Sep. 21, 2004

(54) SEMICONDUCTOR MEMORY DEVICE WITH MEMORY CELLS OPERATED BY BOOSTED VOLTAGE

(75) Inventors: Masanao Yamaoka, Hachioji (JP); Kenichi Osada, Kawasaki (JP); Koichiro Ishibashi, Warabi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/163,310

(22) Filed: Jun. 7, 2002

(65) Prior Publication Data

US 2002/0186581 A1 Dec. 12, 2002

(30) Foreign Application Priority Data

Jun. 12, 2001 (JP) .................................... 2001-176453

(51) Int. Cl.[7] .............................................. G11C 11/00
(52) U.S. Cl. .................. 365/154; 365/227; 257/903
(58) Field of Search ................. 365/154, 51; 257/903

(56) References Cited

U.S. PATENT DOCUMENTS

| | | | | |
|---|---|---|---|---|
| 5,327,002 A | * | 7/1994 | Motoyoshi | .................. 257/380 |
| 5,526,303 A | * | 6/1996 | Okajima | ..................... 365/154 |
| 5,668,770 A | * | 9/1997 | Itoh et al. | .................... 365/227 |
| 5,757,702 A | * | 5/1998 | Iwata et al. | ............ 365/189.05 |
| 6,455,901 B2 | * | 9/2002 | Kameyama et al. | ........ 257/371 |
| 6,569,742 B1 | * | 5/2003 | Taniguchi et al. | .......... 438/303 |

FOREIGN PATENT DOCUMENTS

| JP | 9-185886 | 7/1997 |
|---|---|---|
| JP | 2001-28401 | 1/2001 |

* cited by examiner

Primary Examiner—Hoai Ho
(74) Attorney, Agent, or Firm—Miles & Stockbridge P.C.

(57) ABSTRACT

A memory using an SRAM memory cell intended for low-voltage operation is designed to decrease the threshold value of MOB transistors constituting the memory cell without substantial decrease in the static noise margin, which is the operational margin of the memory cell. To this end, a voltage Vdd' higher than a power supply voltage Vdd of a power supply line for peripheral circuits is supplied from a power supply line for memory cells as a power supply voltage for memory cells. Since the conductance of driver MOB transistors is in-creased, the threshold voltage of the MOB transistors within the memory cells can be reduced without reducing the static noise margin. Further the ratio of width between the driver MOS transistor and a transfer MOB transistor can be set to 1, thereby allowing a reduction in the memory cell area.

13 Claims, 14 Drawing Sheets

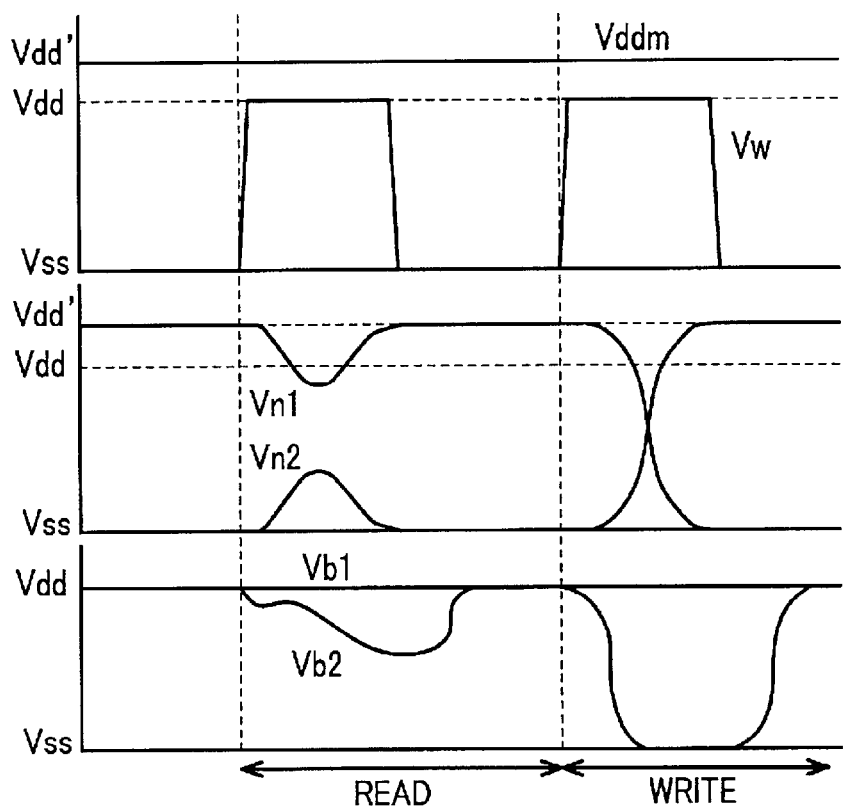
FIG. 3A
FIG. 3B
FIG. 3C
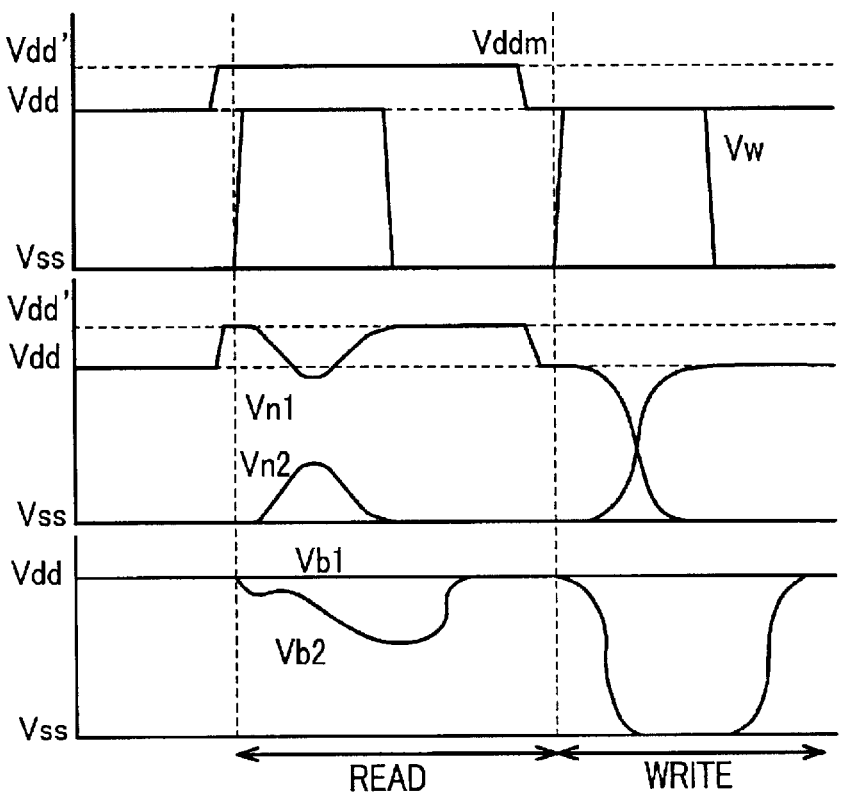
FIG. 4A
FIG. 4B
FIG. 4C

W1/W3 = 1, W1/W2 = 1

W1/W3 = 1, W1/W2 > 2

FIG. 18A
Vddm, Vbp
FIG. 18B
Vssm, Vbn
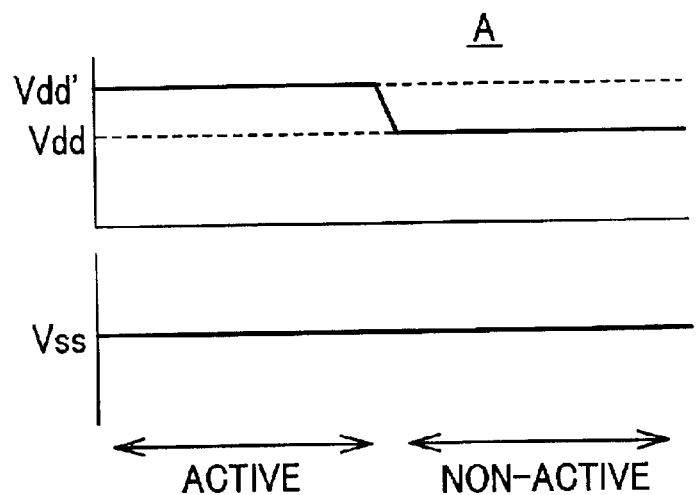
FIG. 19A
Vddm, Vbp
FIG. 19B
Vssm, Vbn
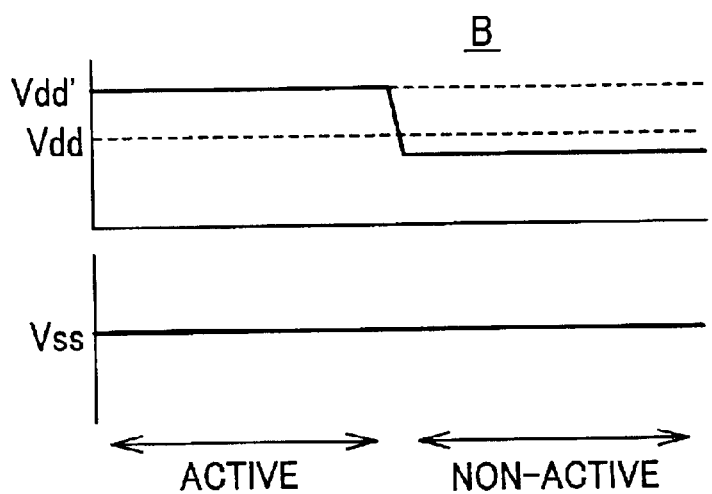

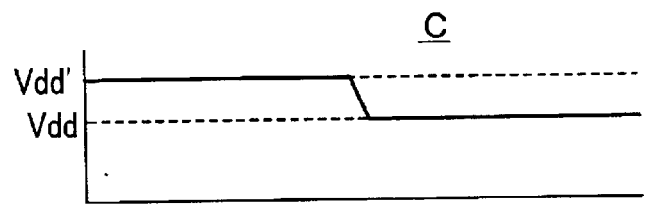
FIG. 20A Vddm
FIG. 20B Vssm
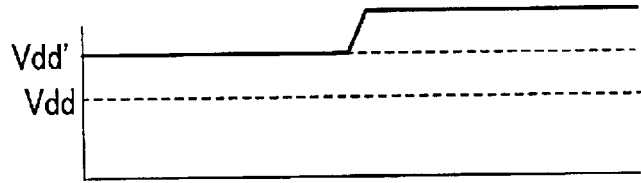
FIG. 20C Vbp
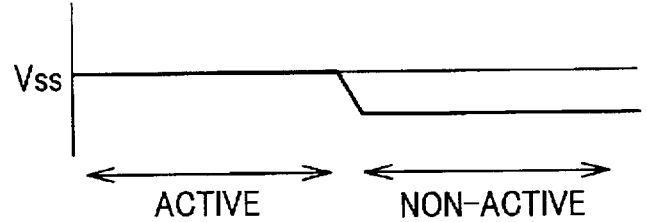
FIG. 20D Vbn
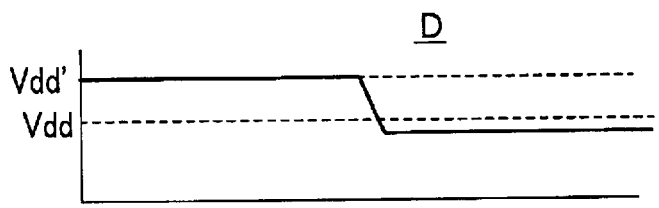
FIG. 21A Vddm
FIG. 21B Vssm
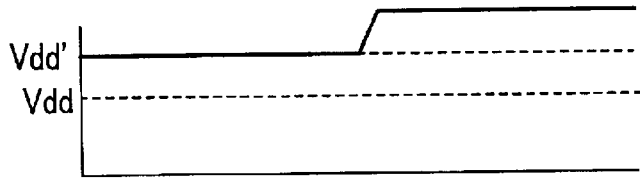
FIG. 21C Vbp
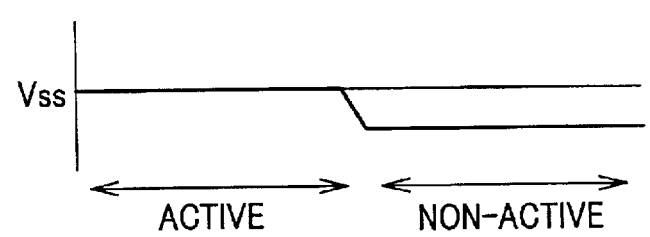
FIG. 21D Vbn Vddm Vssm Vbp Vbn Vddm Vssm Vbp Vbn

SEMICONDUCTOR MEMORY DEVICE WITH MEMORY CELLS OPERATED BY BOOSTED VOLTAGE

BACKGROUND OF THE INVENTION

1. Field of the Invention

The present invention relates to a semiconductor memory device. More particularly, it relates to a semiconductor memory device preferable for a SRAM (Static Random Access Memory) which has secured the operational margin during write operation, and operates at a low voltage and a low electric power.

2. Description of the Related Art

In recent years, there has been an increasingly growing trend towards portable devices, which increases a demand for lower power consumption of a large-scale semiconductor integrated circuit (LSI). Therefore, a technology of an LSI operating at a voltage of not more than 1 V becomes necessary. In the future, presumably, there will be growing demands for a further decrease in supply voltage from that of an LSI operating at a supply voltage of about 0.9 V, so that an LSI operating even at a supply voltage of about 0.5 V will be demanded.

For operating the LSI at a low voltage, the decrease in threshold voltage of a MOS transistor is achieved so that the supply current can be obtained even at a low voltage. However, when the threshold voltage of the MOS transistor in the memory cell of a SRAM has been reduced, the static noise margin, which is the margin with respect to a noise, is reduced, resulting in an unstable read operation. This is shown in FIGS. 24A and 24B. The double-headed arrow line indicated by a reference numeral 11 in FIG. 24A denotes the static noise margin of a prior-art memory cell of which the threshold value is not reduced. In contrast, as shown in FIG. 24B, the static noise margin 12 of the memory cell whose threshold value has been reduced is narrowed.

FIG. 2 is a diagram showing a circuit configuration of a memory cell of a SRAM. The memory cell of the SRAM is made up of N-channel MOS transistors (driver MOS transistors) N1 and N2 whose sources are coupled to each other, P-channel MOS transistors (load MOS transistors) P1 and P2 whose drains are coupled to the drains of the driver MOS transistors N1 and N2, respectively, and N-channel MOS transistors (transfer MOS transistors) N3 and N4 whose gates are respectively coupled to a word line WL, and whose source-drain paths are coupled between bit lines BL and /BL (where the sign "/" is used in place of the bar sign denoting the inversion) and the drains of the driver MOS transistors N1 and N2, respectively.

Incidentally, in FIG. 2, a reference numeral 4 denotes a source line of the load MOS transistors P1 and P2, i.e., a power supply line for the memory cell; 5, a source line of the driver MOS transistor N1 and N2, i.e., normally a ground line for the memory cell; 6 and 7, data holding nodes (storage nodes) of the memory cell; a reference character Vw, the voltage of the word line WL; Vb1 and Vb2, the voltages of the bit lines BL and /BL, respectively; Vddm, the voltage of the power supply line 4 for the memory cell; and Vssm, the voltage of the ground line 5 for the memory cell. Further, Vn1 and Vn2 denote the voltages of the data holding nodes 6 and 7, respectively, which individually correspond to "1" or "0" as data so as to be in the mutually inverse relationship.

Then, a description will be given to a conventionally adopted method for preventing the static noise margin of the SRAM memory cell having such a configuration from being reduced even when the threshold value of each MOS transistor has been reduced.

For preventing the static noise margin of the SRAM memory cell from being reduced even when the threshold voltage of the MOS transistor has been reduced, the conductance of the driver MOS transistors N1 and N2 are required to be made larger as compared with the conductance of the transfer MOS transistors N3 and N4. For attaining this, it is only required as follows: a voltage Vdd' higher than a high-level voltage Vdd of the word line WL is applied as the voltage Vddm of the power supply line 4 for the memory cell to be coupled to the sources of the load MOS transistors P1 and P2, and the voltage to be applied to the gate electrodes of the driver MOS transistors N1 and N2 are set to be higher than the voltages to be applied to the gate electrodes of the transfer MOS transistors N3 and N4. As a result, the conductance of the driver MOS transistors N1 and N2 is increased, and the static noise margin is also increased as shown by a double-headed arrow denoted by a reference numeral 13 in FIG. 24C.

Therefore, with a prior-art SRAM memory intended for low-voltage operation, as disclosed in Japanese Published Unexamined Patent Application No. Hei 9-185886, there are adopted a method in which, only during read operation, the voltage of the power supply lines for the whole memory cell array is increased, or a high voltage is applied to the power supply line for the memory cell to be read, i.e., the memory cell selected during read operation, and other methods.

The reason why the voltage Vddm of the power supply line for the memory cell is boosted only during read operation is because the operational margin during write operation decreases with an increase in ratio between the conductance of the load MOS transistors P1 and P2 and the conductance of the driver MOS transistors. For this reason, with a prior-art method, the voltage Vddm of the power supply line 4 for the selected memory cell or memory cell array is boosted only during read operation to suppress the reduction in the operational margin during write operation.

Incidentally, in Japanese Published Unexamined Patent Application No. Hei 9-185886, it is described as follows: it is also possible to constantly set the power supply potential for the memory cell to be applied to the memory cell higher than the power supply potential for the peripheral circuits only during read operation.

Further, for conventional SRAM memory cells not intended for only low-voltage operation, the conductance of the driver MOS transistors is required to be set larger than the conductance of the transfer MOS transistors as described above in order to ensure a larger static noise margin during read operation. For this reason, the gate width of driver MOS transistor have been manufactured larger than the gate width of the transfer MOS transistor. Particularly, as disclosed in Japanese Published Unexamined Patent Application No. Hei 2001-28401, in the layout of the memory cell used in a prior-art SRAM memory shown in FIG. 9, in spite of the fact that the diffusion regions of the driver MOS transistors and the transfer MOS transistors are formed without curves, the diffusion regions are not arranged in the form of a simple rectangle due to the difference in size of the gate width. Incidentally, in FIG. 9, a reference numeral 33 denotes a contact; 34, N-type diffusion layers serving as the sources and the drains of N-channel MOS transistors (below, referred to as NMOS transistors) N1, N2, N3, and N4; 35, a polysilicon serving as agate electrode; 36, one SRAM memory cell region; and 39, P-type diffusion layers serving as the sources and the drains of P-channel MOS transistors (below, referred to as PMOS transistors) P1, P2, P3, and P4.

Further, the same prior-art example of Japanese Published Unexamined Patent Application No. Hei 2000-28401 describes as follows. In order for the ratio of the gate width between the driver MOS transistor and the transfer MOS transistor to be 1, the manufacturing process is changed in the following manner. For example, each gate oxide film thickness of the transfer MOS transistors N3 and N4 is increased as compared with that of the driver MOS transistors N1 and N2, alternatively, the impurity concentration of a low-concentration drain region for electric field relaxation is reduced, thereby to cause a difference in driveability, resulting in an increase in so-called cell ratio.

However, with the prior-art method in which a high voltage is applied to the power supply line for the memory cell array only during read operation described above, it takes much time for the power supply voltage Vddm for the memory cell array to change into a desired voltage Vdd' higher than the power supply voltage Vdd for the peripheral circuits. Further, an extra electric power required for charge and discharge of the power supply line is consumed for increasing and decreasing the voltage of the power supply line for the memory cell array. Accordingly, although this circuit is a SRAM circuit operating at a low voltage, it becomes incapable of implementing the lower power consumption. This is due to the following fact. Even when only the power supply voltage Vddm for the selected memory cell for executing the read operation is boosted, the power consumption is increased to one degree or another. Whereas, when the power supply voltage for the memory cell is constantly set higher than the power supply voltages for the peripheral circuits and the like, it is necessary that the ground voltage for the memory cell is set higher than the ground voltage of the peripheral circuits during write operation and during standby, and that the ground voltage for the memory cell is set at the same level as the ground voltage for the peripheral circuits only during read operation. This eventually requires the relative increase and decrease in voltage between power supply lines, so that the extra electric power required for charge and discharge of the power supply lines is consumed.

Further, by forming the diffusion regions 34 and 39 as shown in FIG. 9, and the polycrystal silicon (polysilicon) layer 35 in a line form to generate a high-symmetry layout, it has become possible to suppress the variations in manufacturing as compared with the layout previous to that, wherein less symmetry is present, and the polysilicon is curved. However, with this layout, each gate width W1 of the driver MOS transistors N1 and N2 is different from each gate width W3 of the transfer MOS transistors N3 and N4 for controlling the conductance. As a result, the diffusion regions 34 and 37 are formed in a shape falling short of a perfect rectangle as shown in FIG. 9. Actually, by setting the ratio W1/W3 of the gate width W1 of the driver MOS to the gate width W3 of the transfer MOS to be 1.5 to 2, the ratio of the conductance between the driver MOS transistor and the transfer MOS transistor is controlled to secure the static noise margin. Therefore, as compared with the SRAM memory cell which has not yet adopted this layout, the variations in manufacturing are reduced. However, as compared with the case where the diffusion regions are formed in perfect rectangle, the variations can be considered to be larger.

Further, as described in the same prior-art example of Japanese Published Unexamined Patent Application No. Hei 2000-28401, with the method in which the gate width ratio W1/W3 of 1 is achieved by the change in manufacturing process, for example by changing the impurity concentration of the driving force, and thereby increasing the cell ratio, unfavorably, the manufacturing conditions become complicated, resulting in a reduction of yield, and the number of manufacturing steps is increased, incurring a rise in cost.

SUMMARY OF THE INVENTION

An object of the present invention is to provide a semiconductor memory device preferable for a SRAM memory which has secured a static noise margin, and is capable of achieving both the low voltage operation and the low power consumption.

Further, it is another object of the present invention to provide a semiconductor memory device wherein while securing the static noise margin, the gate width ratio between a driver MOS transistor and a transfer MOS transistor is set to be 1 to enable the rectangle layout of diffusion regions, resulting in small manufacturing variations.

In order to solve the foregoing problems, a semiconductor memory device in accordance with the present invention, comprises: a semiconductor substrate, and static type memory cells each comprising N-channel type two driver MOB transistors and two transfer MOB transistors, and P-channel type two load MOB transistors, the static type memory cells being placed in an array on the semiconductor substrate, source electrodes of the driver MOS transistors being coupled to a first operating potential node, and source electrodes of the load MOB transistors being coupled to a second operating potential node, and characterized in that, if it is assumed that the potential difference between the first operating potential node and the second operating potential node is a first potential difference, and that the potential difference between a high-level potential to be applied to gate electrodes of the transfer MOB transistors and the potential of the second operating node is a second potential difference, the first potential difference is set to be larger than the second potential difference in the state in which the memory cells are being operated.

Namely, the device is so configured that a voltage higher than the High voltage Vdd of the word line is constantly applied to the power supply line for the memory cell array during the period in which the SRAM is operating including not only the time of read operation but also the time of write operation. As described in the description on the prior art, the increase in potential of the power supply line for the memory cells during write operation decreases the operational margin during write operation. Therefore, it has been conventionally considered better that such an increase in potential is not done.

However, an attention has been given to the following fact. By boosting the voltage Vddm of the power supply line for the memory cell array, the voltage applied between the gate and the source of the driver MOS transistor becomes higher than the voltage applied between the gate and the source of the transfer MOS transistor. As a result, the conductance of the driver MOS transistor becomes larger than the conductance of the transfer MOS transistor. By positively using this fact, it becomes possible to set the gate width ratio W1/W3 of the gate width W1 of the driver MOS transistor to the gate width W3 of the transfer MOS transistor to be smaller as compared with the memory cell in the prior-art memory cell array whose power supply voltage Vddm will not be boosted.

There is a problem that the noise margin during write operation is reduced when the power supply voltage Vddm for the memory cell array is boosted regardless of the write or read operation. As described below, the boost in voltage Vddm allows the layout resulting in a narrow range of variations in circuit manufacturing. Namely, it becomes possible to set the gate width ratio W1/W3 of the driver MOS transistor to the transfer MOS transistor to be 1 while securing the static noise margin. As a result, it is possible to form the diffusion regions in a perfect rectangle when the memory cells are laid out as shown in FIG. 10 without changing the manufacturing process. Accordingly, it also becomes possible to suppress the variations in manufacturing.

Thus, it is possible to suppress the variations in manufacturing. In consequence, it becomes possible to control the operational margin which has been required during operation to a lower level. Therefore, it is possible to solve the problem that the operational margin during write operation is decreased when the power supply voltage Vddm for the memory cell array has been boosted.

Further, although the variations in manufacturing have been reduced, and the required operational margin has been reduced, there is also a possibility that the operational margin during write operation enough for the circuit operation cannot be actually obtained. Therefore, the threshold voltage of the PMOS transistor is set higher than the threshold voltage of the NMOS transistor. As a result, the ratio between the conductance of the load MOS transistor and the conductance of the transfer MOS transistor in the memory cell is reduced, so that it is possible to increase the operational margin during write operation.

The foregoing and other objects of the invention will become more apparent by referring to the following detailed description and appended claims when considered in connection with the accompanying drawings. It is noted that the same reference characters and numerals designate the same or like parts in the accompanying drawings.

BRIEF DESCRIPTION OF THE DRAWINGS

FIGS. 3A to 3C are diagrams respectively showing the changes in electric potential of respective elements of the memory cell during operation of the memory in Embodiment 1;

FIGS. 4A to 4C are diagrams respectively showing the changes in voltage of respective elements of the memory cell during operation of the memory in a prior-art example in which the voltage is boosted only during read operation;

FIGS. 18A and 18B are diagrams showing a power supply voltage application pattern example A during the active state and during the non-active state of the voltages to be applied to the memory cell in Embodiment 10;

FIGS. 19A and 19B are diagrams showing a power supply voltage application pattern example B during the active state and during the non-active state of the voltages to be applied to the memory cell in Embodiment 10;

FIGS. 20A to 20D are diagrams showing a power supply voltage application pattern example C during the active state and during the non-active state of the voltages to be applied to the memory cell in Embodiment 10;

FIGS. 21A to 21D are diagrams showing a power supply voltage application pattern example D during the active state and during the non-active state of the voltages to be applied to the memory cell in Embodiment 10;

DETAILED DESCRIPTION OF THE PREFERRED EMBODIMENTS (Embodiment 1)

Figure 1:
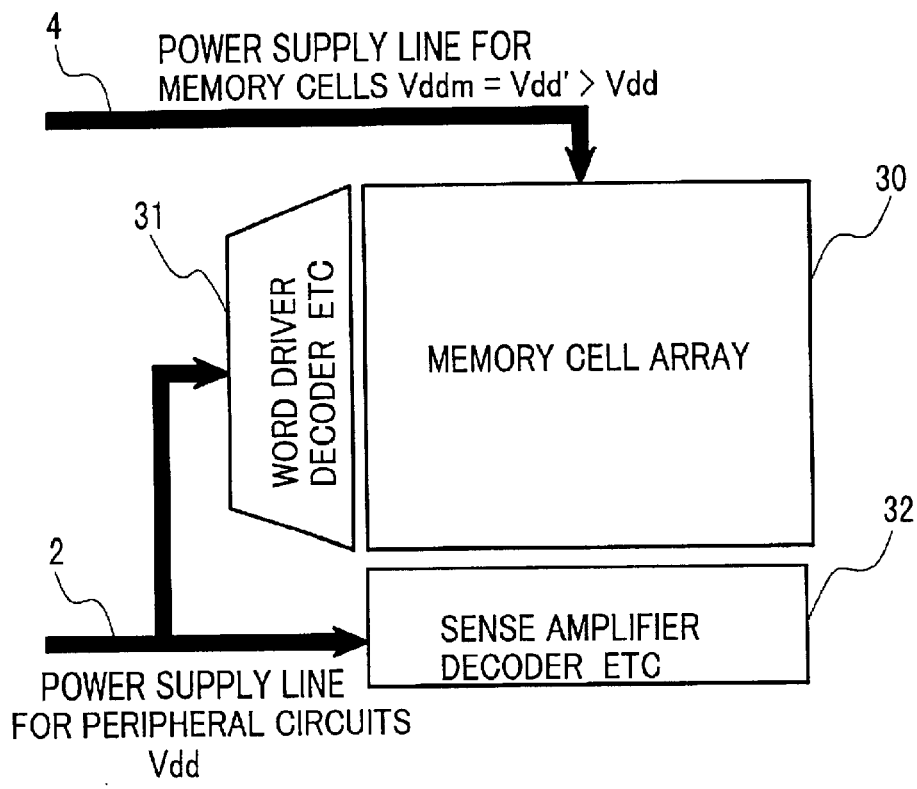
FIG. 1 is a block diagram showing a memory cell array and peripheral circuits, and a configuration of power supply to be supplied thereto in Embodiment 1.

FIG. 1 is a block diagram showing a memory cell array 30 constituting a SRAM memory in accordance with the present invention, a peripheral circuit 31 of the memory including a word driver, a decoder, and the like, a peripheral circuit 32 of the memory including a sense amplifier, a decoder, and the like, and the relationship between respective voltages Vdd and Vddm of power supply lines 2 and 4 to be supplied to the memory cell array 30 and the peripheral circuits 31 and 32. A voltage Vdd' higher than the voltage Vdd of the power supply line 2 for the peripheral circuits 31 and 32 other than the memory cell array is applied to the power supply line 4 for the memory cell array 30. Incidentally, the same ground voltage Vss is applied to the source line of memory cell driver MOS transistors in the memory cell array 30, and the ground lines for other peripheral circuits, which are not shown.

Figure 2:
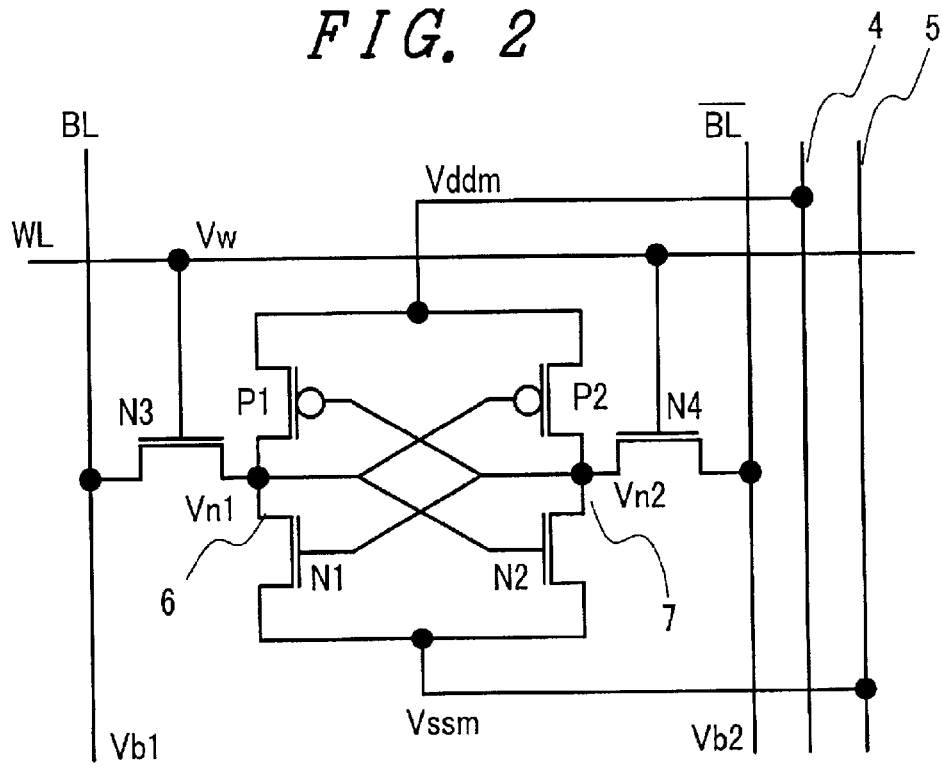
FIG. 2 is a circuit configuration diagram of a SRAM memory cell to which the present invention is applied.

The configuration of the memory cell of the SRAM memory in this embodiment is the same as that of the memory cell of the prior-art SRAM memory shown in FIG. 2, wherein one memory cell is composed of 6 transistors. Therefore, also in this embodiment, a description will be given to the memory cell by reference to FIG. 2. The same goes for other embodiments.

In the memory cell of FIG. 2, the voltage of a word line WL is referred to as Vw; the voltages of bit lines BL and /BL, Vb1 and Vb2, respectively; the voltage of the power supply line 4 for the memory cell, Vddm; the voltage of the ground line 5 for the memory cell, Vssm; and the voltages of the data holding nodes 6 and 7 of the memory cell, Vn1 and Vn2, respectively. Further, the power supply voltage and the ground voltage of the peripheral circuits are referred to as Vdd and Vss, respectively.

By keeping the power supply voltage Vddm for the memory cell at the voltage Vdd' higher than the word line voltage Vw and the bit line voltages Vb1 and Vb2, the gate-source voltage of each of the driver MOS transistors N1 and N2 of the SRAM cell becomes higher than the gate-source voltage of each of the transfer MOS transistors N3 and N4. As a result, the conductance of the driver MOS transistors N1 and N2 becomes larger than the conductance of the transfer MOS transistors N3 and N4, resulting in an increase in noise margin of the SRAM memory cell. Therefore, it becomes possible to set the threshold value of each of the MOS transistors at a lower level for allowing the operation at a low voltage.

FIGS. 3A to 3C respectively show the changes in potential of respective elements of the memory cell during operation of the memory in this embodiment. FIGS. 4A to 4C respectively show the changes in voltage of respective elements of the memory cell during operation of the memory when the voltage is boosted only during read operation in the prior-art example. FIGS. 3A and 4A show the changes in electric potential of the word line voltage Vw and the power supply voltage Vddm for the memory cell. FIGS. 3B and 4B show the voltage changes in the respective voltages Vn1 and Vn2 of the data holding nodes of the memory cell. FIGS. 3C and 4C show the voltage change of the bit line voltages Vb1 and Vb2.

In FIG. 4C, the bit line electric potential before read operation is High, which is different from the example shown in the prior-art example. However, if it is assumed that the same operations in the example of FIGS. 3A to 3C shown in the present invention are performed, the electric potentials shown in FIGS. 4A to 4C are obtained. As the power supply voltage Vddm for the memory array, a voltage Vdd which is the voltage equal to the voltage of the peripheral circuits is generally applied.

The voltage Vdd' higher than the power supply voltage for the peripheral circuits is applied as the power supply voltage Vddm for the memory array during read operation. Thereafter, the word line voltage Vw is allowed to rise from Low to High, so that the data holding nodes (storage nodes) 6 and 7 in the selected memory cell are coupled to the bit lines BL and /BL, respectively. In conjunction with this, a potential difference is generated between the bit line voltages Vb1 and Vb2 by the MOS transistor of the memory cell, so that the data in the memory cell is read.

During write operation, the voltage Vdd equal to the power supply voltage for the peripheral circuits is applied as the power supply voltage Vddm for the memory cell array. After the power supply voltage Vddm for the memory cell array has changed to the voltage Vdd, the word line voltage Vw is allowed to rise, and data is written from a write circuit (not shown) to the bit lines BL and /BL, so that the voltages Vb1 and Vb2 of the bit lines go to High and LOW, respectively. As a result, the voltages Vn1 and Vn2 of the storage nodes in the memory cell become HIGH and LOW voltages, respectively for storing the data to be written, so that the data is written.

In the case of FIG. 4B, the voltages Vn1 and Vn2 of the storage nodes in the memory cell to be reversed for write operation are smaller as compared with the case of FIG. 3B. Further, when write and read operations are alternately performed, the power supply voltage for the memory array is required to be boosted and stepped down. Namely, as shown in FIG. 4A, when the memory is operated at a low voltage, the power supply voltage Vddm for the memory cell has been boosted from the voltage Vdd to the voltage Vdd' only during read operation in the prior-art example. With this method, the power supply voltage Vddm for the memory cell is required to be boosted and stepped down repeatedly for every operation, resulting in an increase in power consumption.

In contrast, in this embodiment, as apparent from FIG. 3A, as the power supply voltage Vddm for the memory cell array, the voltage Vdd' higher than the power supply voltage Vdd for the peripheral circuits is constantly applied during the operation of the memory regardless of the read or write operation.

During read operation, the word line voltage Vw rises from LOW to HIGH, so that the storage nodes 6 and 7 in the selected memory cell are coupled to the bit lines BL and /BL, respectively. In conjunction with this, a potential difference is generated between the bit line voltages Vb1 and Vb2 by the MOS transistors of the memory cell, so that the data in the memory cell is read.

During write operation, the word line voltage Vw rises, and data is written from a write circuit (not shown) to the bit lines BL and /BL, so that the voltages Vb1 and Vb2 of the bit lines go to High and LOW, respectively. As a result, the voltages Vn1 and Vn2 of the storage nodes in the memory cell become HIGH and LOW voltages, respectively for storing the data to be written, so that the data is written.

In this embodiment, the voltage Vdd' higher than the power supply voltage Vdd for the peripheral circuits is constantly applied to the power supply line 4 for memory cells. Therefore, it is possible to suppress the power consumption caused by boosting and stepping down of the voltage of the power supply line 4 as in the prior-art example.

Since the power supply voltage Vddm for the memory cell is constantly kept at a high electric potential, the voltage Vn1 of the storage node is kept high. Accordingly, even when the power supply voltage Vdd for the peripheral circuits is low, the data will not be corrupted during read operation. Further, since the voltage Vw of the word line corresponds to the power supply voltage Vdd for the peripheral circuits, the voltage of each bit line is kept at not more than Vdd.

Figure 25:
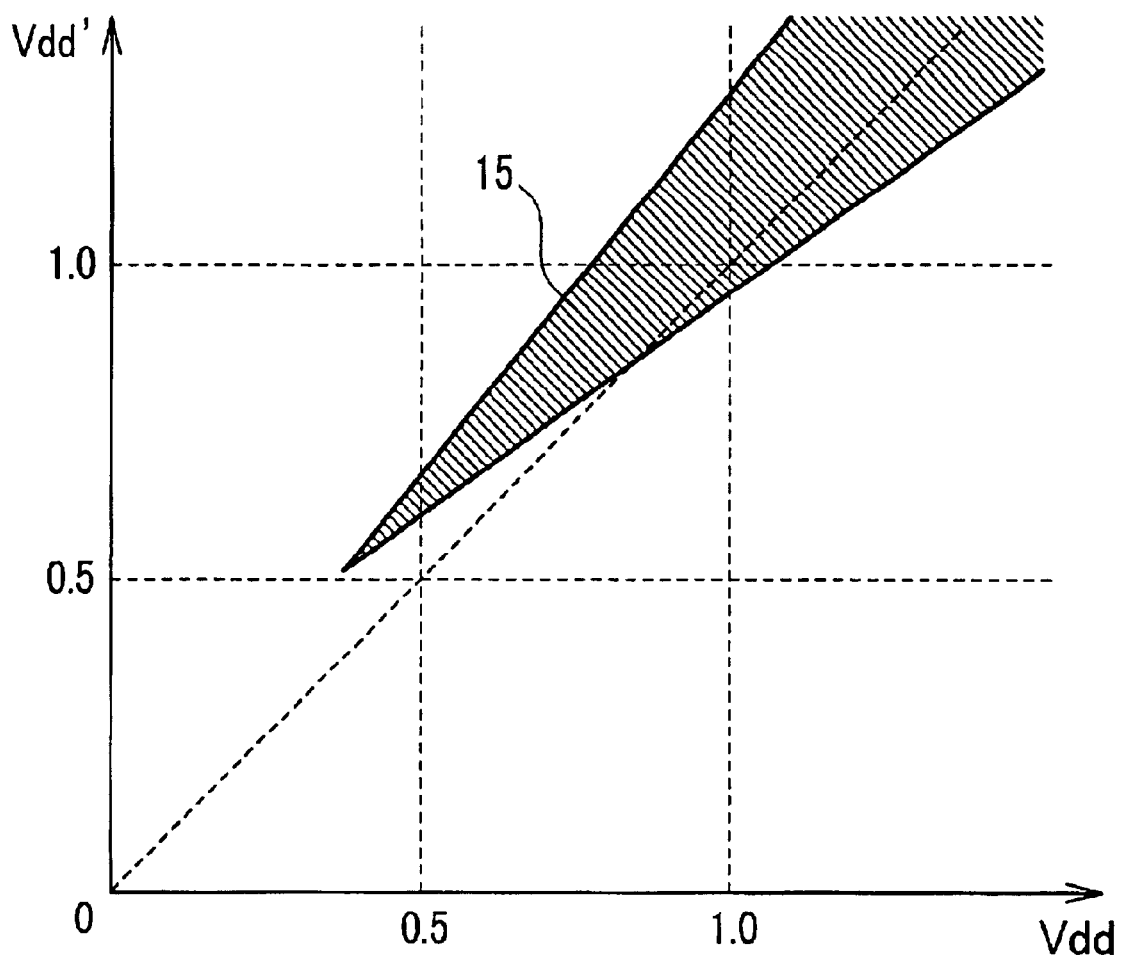
FIG. 25 is a diagram showing the relationship between the power supply voltages Vdd and Vdd' at which the memory cell in Embodiment 1 operates.

Herein, FIG. 25 shows the relationship between the power supply voltages Vdd and Vdd' at which the memory cell of this embodiment operates. When Vdd is plotted as abscissa, and the boosted power supply voltage Vdd' for the memory cell array as ordinate, the region denoted by a reference numeral 15 corresponds to the operating range of the memory cell array. This indicates that the SRAM memory cell operates even at a power supply voltage as low as about 0.5 V.

Figure 6:
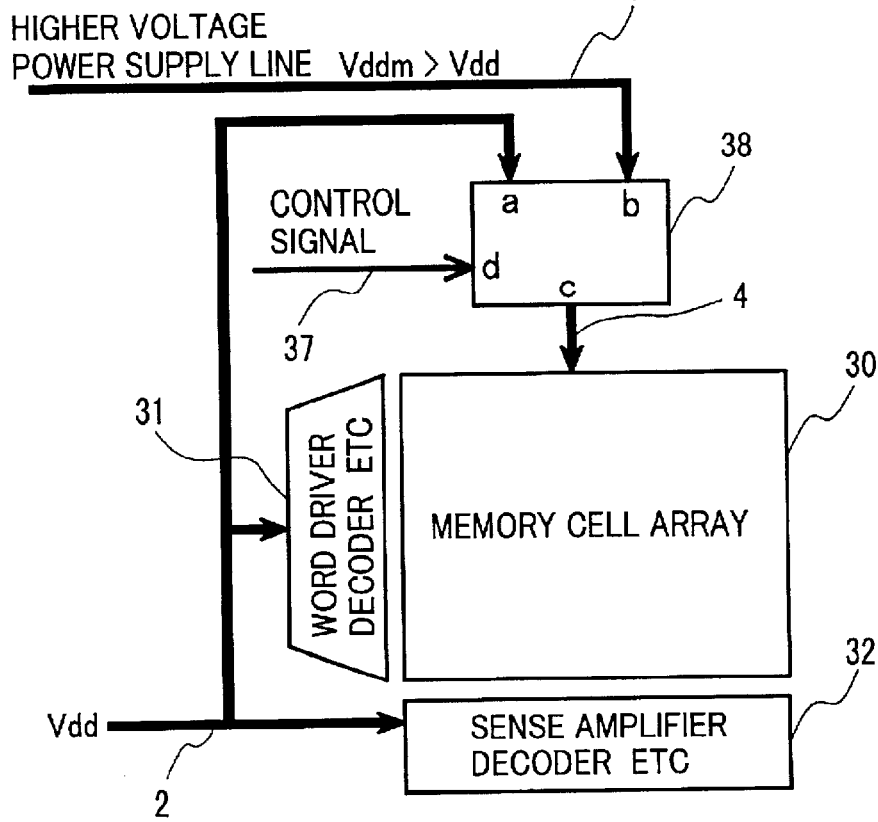
FIG. 6 is a block diagram showing an example of a configuration in a case where as the power supply voltages for the memory cell array, different voltages are supplied between during write operation and during read operation as in the prior-art example.

Incidentally, when different voltages are supplied between during write operation and during read operation as the voltage of the power supply line 4 for the memory cell array as in the prior-art example, for example, a switching circuit 38 as shown in FIG. 6 and a control circuit (not shown) become necessary. The switching circuit 38 is the circuit for switching an input terminal a or an input terminal b based on the value of a signal of a control signal line 37 from the control circuit, and coupling it to an output terminal c. With this configuration, it is controlled so that a power supply line 2 of an electric potential Vdd for the peripheral circuits coupled to the input terminal a and a higher voltage power supply line 4' of a higher-potential voltage Vddm than Vdd coupled to the input terminal b are switched between during write operation and during read operation, and coupled to the power supply line 4 coupled to the output terminal c of the switching circuit 38 in response to the control signal from the control signal line 37 inputted to the terminal d. As a result, it is possible to supply different power supply potentials to the memory cell array 30. In the prior-art example, the circuit as shown in FIG. 6 or a circuit for dynamically changing the power supply voltage becomes necessary, resulting in a larger chip area as compared with the case of the configuration of FIG. 1.

(Embodiment 2)

Figure 5:
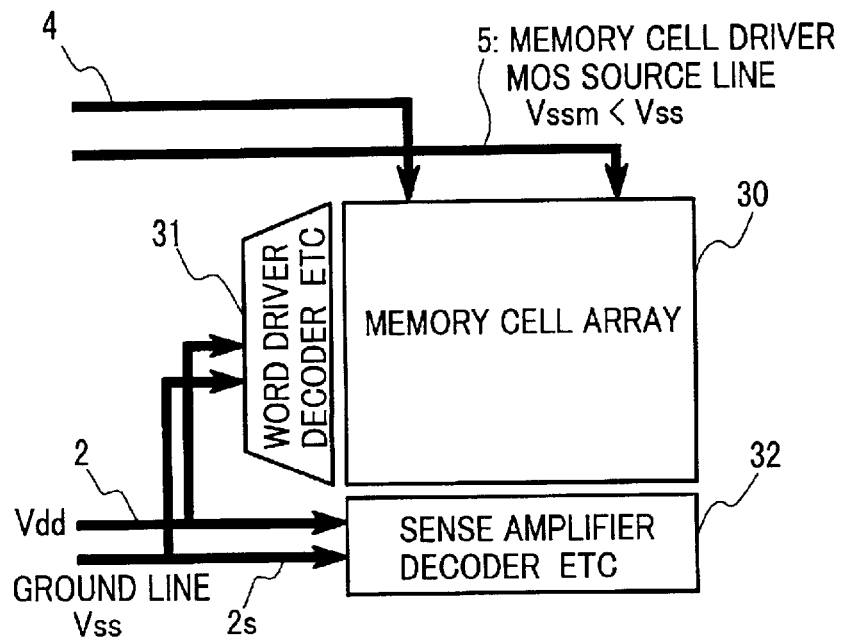
FIG. 5 is a block diagram showing a memory cell array and peripheral circuits, and a configuration of power supply to be supplied thereto in Embodiment 2.

FIG. 5 shows another embodiment of the power supply configuration for the memory cell array constituting the SRAM memory in accordance with the present invention, and the peripheral circuits of the memory including a sense amplifier, a decoder, and the like. This configuration is different from the configuration of FIG. 1 described above in that the same voltage Vdd as that of the power supply line 2 for the peripheral circuits is applied as the voltage Vddm of the power supply line 4 for the memory array, and in that a voltage lower than a ground voltage Vss of a ground line 2s for the peripheral circuits other than the memory cell array is applied as a source line voltage Vssm of a memory cell driver MOS source line 5.

By keeping the source line voltage Vssm of the memory cell driver MOS transistors lower than the word line voltage Vw and the bit line voltages Vb1 and Vb2, the gate-source voltage of the driver MOS transistors N1 and N2 of the SRAM cell becomes higher than the gate-source voltage of the transfer MOS transistors N3 and N4. As a result, the conductance of the driver MOS transistors N1 and N2 becomes larger than the conductance of the transfer MOS transistors N3 and N4, resulting in an increase in noise margin of the SRAM memory cell. Therefore, it becomes possible to set the threshold value of the MOS transistors at a lower level for allowing the operation at a low voltage.

(Embodiment 3)

Figure 7:
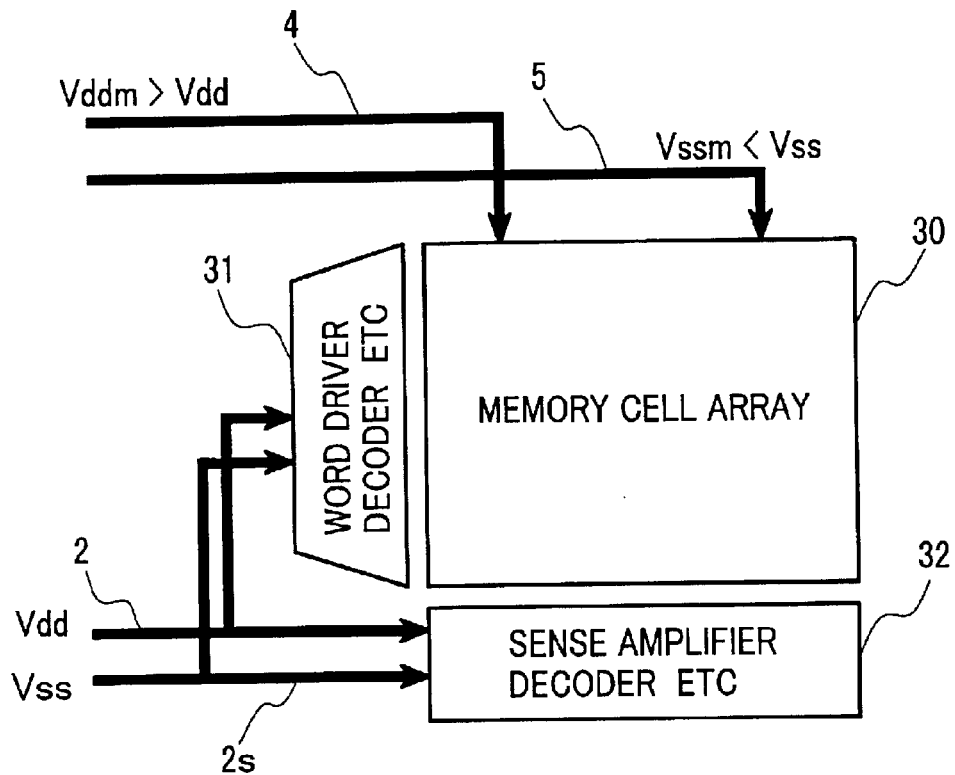
FIG. 7 is a block diagram showing a memory cell array and peripheral circuits, and a configuration of power supply to be supplied thereto in Embodiment 3.

FIG. 7 shows a still other embodiment of the power supply configuration for the memory cell array constituting the SRAM memory in accordance with the present invention, and the peripheral circuits of the memory including a sense amplifier, a decoder, and the like. This configuration is similar to the configuration of FIG. 5, but different therefrom in that the voltage Vdd' higher than the power supply voltage Vdd for the circuits other than the memory cell array is coupled to the memory cell array 30 as the power supply voltage Vddm for the memory array.

Also with such a configuration, by keeping the memory array power supply voltage Vddm higher than the word line voltage Vw and the bit line voltages Vb1 and Vb2, and keeping the source line voltage Vssm of the memory cell driver MOS transistors lower than the word line voltage Vw and the bit line voltages Vb1 and Vb2, the gate-source voltage of the driver MOS transistors N1 and N2 of the SRAM cell becomes higher than the gate-source voltage of the transfer MOS transistors N3 and N4. As a result, the conductance of the driver MOS transistors N1 and N2 becomes larger than the conductance of the transfer MOS transistors N3 and N4. This results in an increase in noise margin of the SRAM memory cell. Therefore, it becomes possible to set the threshold voltage of the MOS transistors at a lower level for allowing the operation at a low voltage.

(Embodiment 4)

Figure 8:
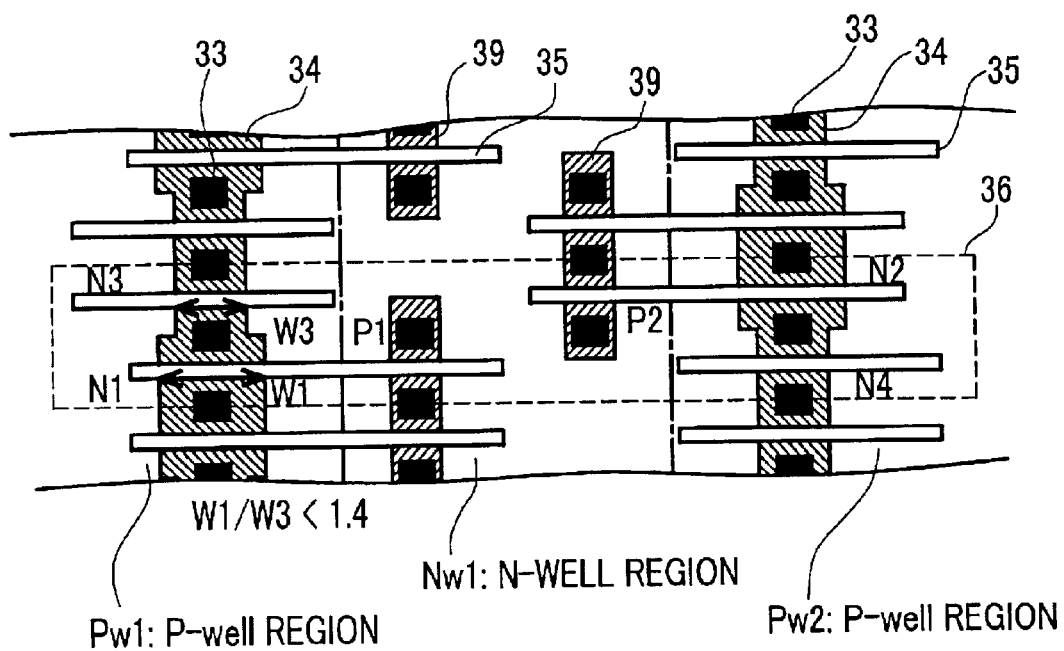
FIG. 8 is a diagram showing one example of the layout of a memory cell in Embodiment 4.
Figure 9:
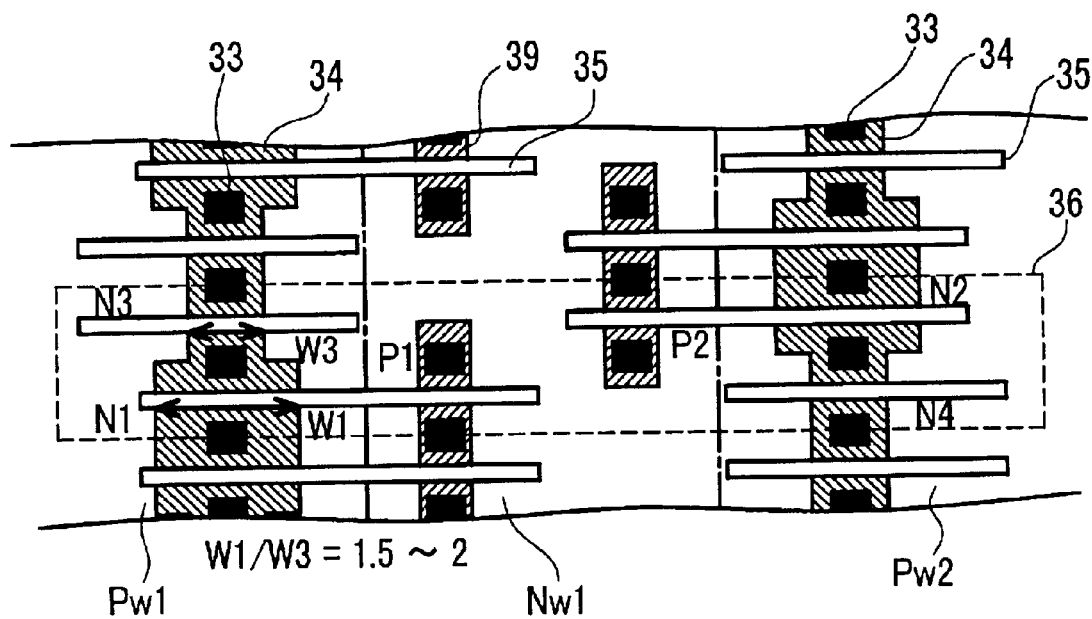
FIG. 9 is a diagram showing a layout example of the prior-art memory cell of the SRAM memory cell array circuit shown in FIG. 2.

FIG. 8 is one example of the memory cell array layout in accordance with the present invention of the SRAM memory cell circuit shown in FIG. 2. Incidentally, in FIG. 8, the same constituent elements as those in the prior-art memory cell layout shown in FIG. 9 of the SRAM memory are given the same reference characters and numerals as those in that figure.

The layout is as follows. The driver MOS transistor N1 and the transfer MOS transistor N3 are formed in a P-well region Pw1. The center line of the diffusion layers 34 of the driver MOS transistor N1 and the transfer MOS transistor N3 parallel to the boundary between the P-well region Pw1 and an N-well region Nw1 in which the load MOS transistors P1 and P2 are formed is configured substantially in a line. Further, the diffusion layers 34 are disposed axisymmetrically with respect to the center line.

Further, similarly, the layout is as follows. The driver MOS transistor N2 and the transfer MOS transistor N4 are formed in a P-well region Pw2. The center line of the diffusion layers 34 of the driver MOS transistor N2 and the transfer MOS transistor N4 parallel to the boundary between the P-well region Pw2 and the N-well region Nw1 in which the load MOS transistors P1 and P2 are formed is configured substantially in a line. Further, the diffusion layers 34 are disposed axisymmetrically with respect to the center line.

The part encircled by a dotted line 36 denotes one memory cell. The memory cells are arranged in such a manner as to turn back and forth repeatedly along vertical and horizontal directions, thereby to configure the memory array.

As described above, in the prior-art memory cell, in order for the conductance of the driver MOS transistors N1 and N2 to be larger than the conductance of the transfer MOS transistors N3 and N4, the gate width W1 of the driver MOS transistors N1 and N2 is required to be made larger than the gate width W3 of the transfer MOS transistors N3 and N4. For this reason, in general, a MOS transistor having a W1/W3 ratio of not less than 1.5 has been used.

In contrast, as described in Embodiment 1, since the voltage Vdd' higher than the voltage Vw of the word line WL is applied as the power supply voltage Vddm for the memory cell, the conductance of the driver MOS transistors becomes larger as compared with the conductance of the transfer MOS transistors. Accordingly, with the memory cell layout of this embodiment, it becomes possible to set the ratio W1/W3 of the gate width W1 of the driver MOS transistors to the gate width W3 of the transfer MOS transistors to be less than 1.4. This results in a smaller area than that of the prior-art memory cell.

(Embodiment 5)

Figure 10:
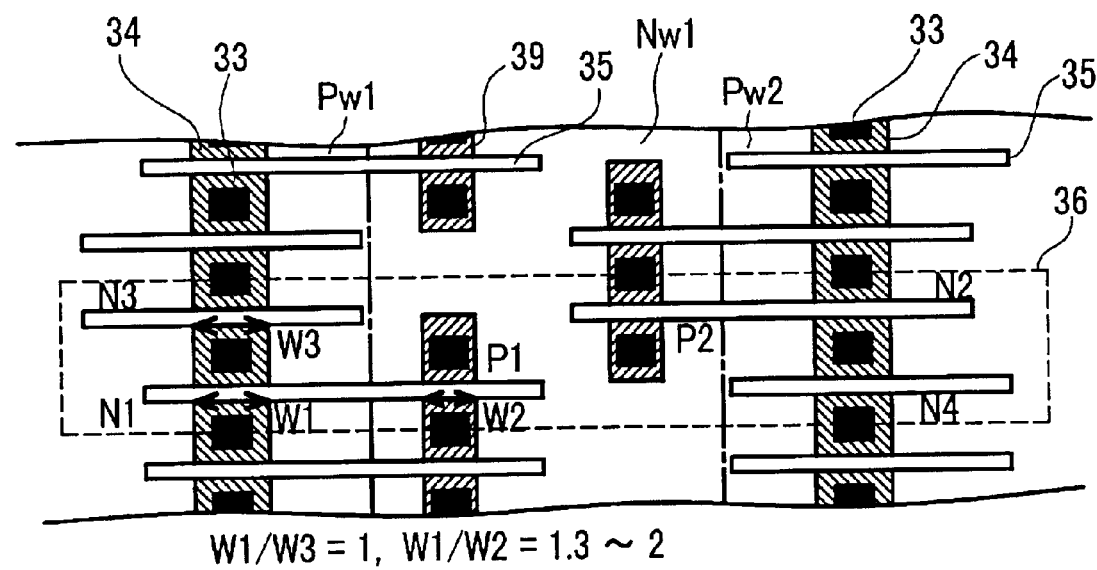
FIG. 10 is a diagram showing one example of the layout of a memory cell in Embodiment 5.

FIG. 10 is another example of the memory cell layout in accordance with the present invention of the SRAM memory cell circuit shown in FIG. 2. Incidentally, in FIG. 10, the same constituent elements as those in the prior-art memory cell layout shown in FIG. 9 of the SRAM memory are given the same reference characters and numerals as those in that figure. The memory cell used for the layout of FIG. 10 is configured as follows. Since the voltage Vdd' higher than the voltage Vw of the word line WL is applied as the power supply voltage Vddm for the memory cell as with the memory cell of Embodiment 4 described above, the gate width ratio W1/W3 between the driver MOS transistors and the transfer MOS transistors is made smaller than that of the prior-art memory cell. Particularly, the gate width ratio W1/W3 is set to be 1.

When the gate width ratio W1/W3 is set to be 1, for the memory cell in which the diffusion regions of the driver MOS transistors N1 and N2 and the transfer MOS transistors N3 and N4 are formed in a line as shown in FIG. 10, it is possible to form the diffusion regions 34 of the NMOS transistors into a perfect rectangle. As a result, it becomes possible to largely reduce the variations generated when the diffusion regions are formed on a silicon substrate. This enables the manufacturing of a memory cell with a high dimensional precision, i.e., a memory cell showing less performance variations. Further, the gate width of the driver MOS transistors N1 and N2 is smaller than in the prior art. Accordingly, it also becomes possible to reduce the memory cell area 36.

(Embodiment 6)

Figure 11:
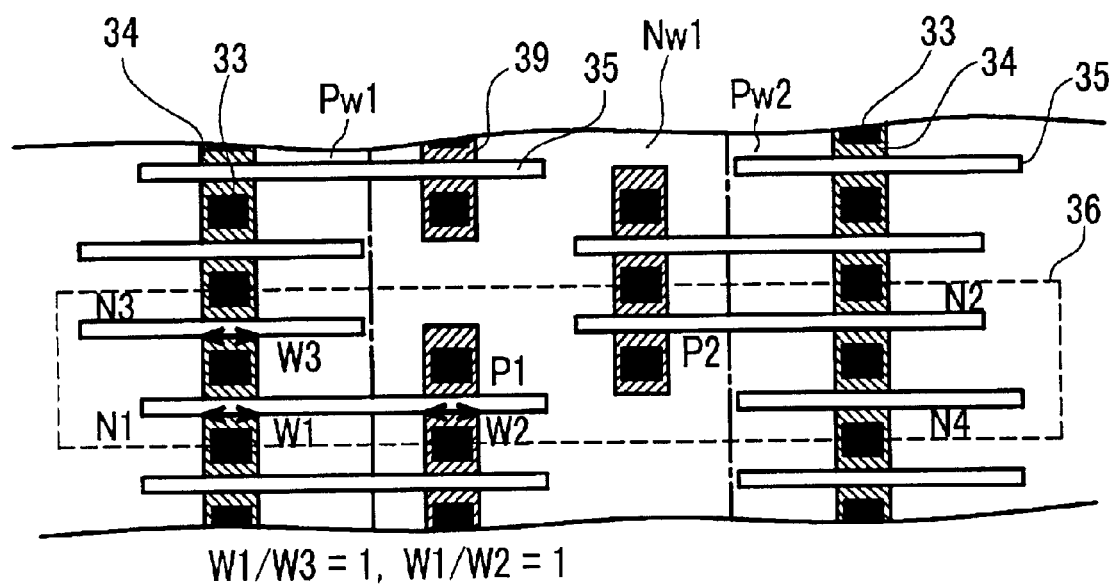
FIG. 11 is a diagram showing one example of the layout of a memory cell in Embodiment 6.

FIG. 11 shows an example of the layout of the memory cell in which the ratio W1/W3 of the gate width W1 of the driver MOS transistors N1 and N2 to the gate width W3 of the transfer MOS transistors N3 and N4 is set to be 1 as with the memory cell layout of FIG. 10. Further, in the layout, the gate width W2 of the load MOS transistors P1 and P2 in the memory cell is set equal to the gate widths W1 and W3 of the driver MOS transistors and the transfer MOS transistors.

Generally, for the SRAM memory cell, the conductance of the load MOS transistors has been required to be set smaller than the conductance of the transfer MOS transistors for sufficiently ensuring the stability during write operation. In contrast, for the memory cell used for the layout of FIG. 11, by setting the threshold voltage of the load MOS transistors P1 and P2 at a larger level, the conductance of the load MOS transistors is made smaller. Accordingly, the gate width of the transfer MOS transistors and the driver MOS transistors is made still smaller. As a result, the area of the whole memory cell has been further reduced.

(Embodiment 7)

Figure 12:
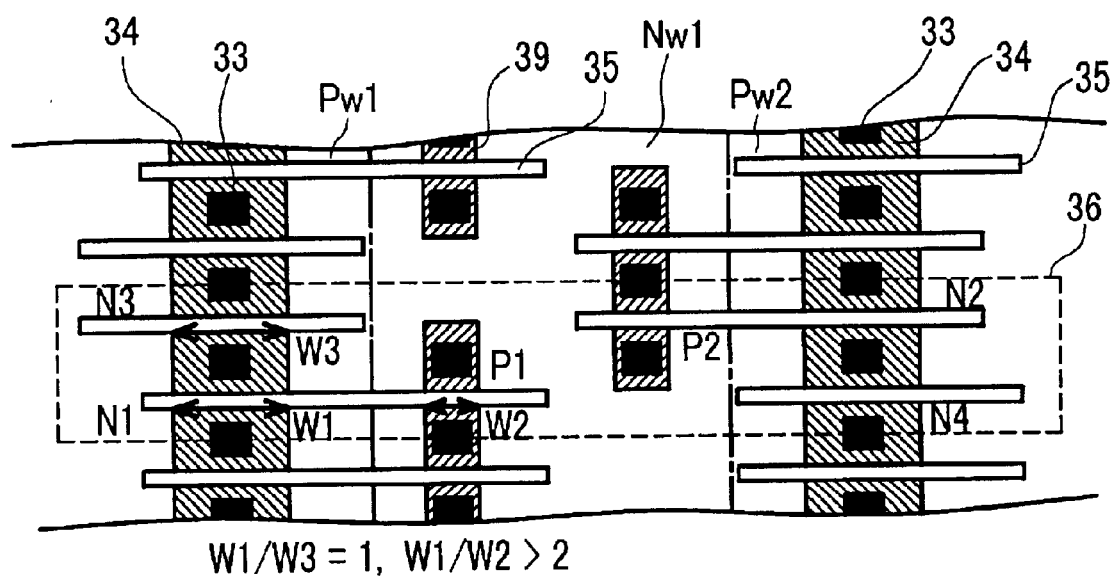
FIG. 12 is a diagram showing one example of the layout of a memory cell in Embodiment 7.

FIG. 12 shows a memory cell layout in which the ratio W1/W3 of the gate width W1 of the driver MOS transistors N1 and N2 to the gate width W3 of the transfer MOS transistors N3 and N4 is set to be 1 as with the memory cell layout of FIG. 10. Further, in the layout, each of the gate widths W1 and W3 is set to be not less than twice as large as (W1/W2>2) the gate width of the load MOS transistors P1 and P2.

By setting these gate widths to be large, it becomes possible to obtain a larger memory cell current, which enables the higher-speed operation of the memory. This indicates that the present invention is usable for not only a SRAM circuit operating at a low voltage, but also a SRAM circuit operating at high speed.

(Embodiment 8)

Figure 13:
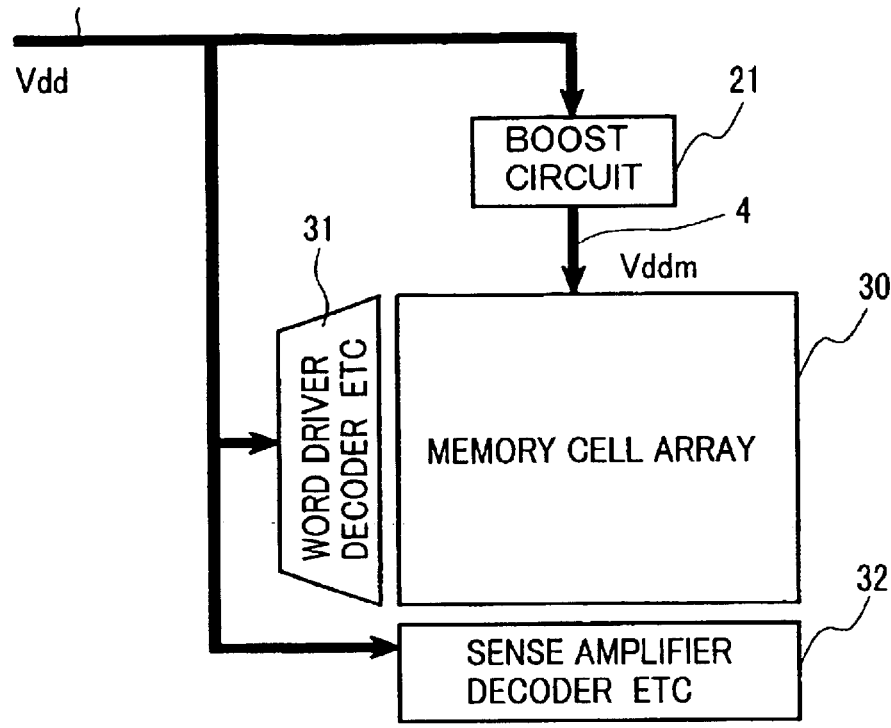
FIG. 13 is a block diagram showing a memory cell array and peripheral circuits, and a configuration of power supply to be supplied thereto in Embodiment 8.

FIG. 13 is a diagram showing an example of the coupling configuration of power supply lines for a memory circuit composed of a combination of the memory cell array 30, the peripheral circuit 31 including a word driver, a decoder, and the like, and the peripheral circuit 32 including a sense amplifier, a decoder, and the like.

To this memory circuit, a single power supply voltage Vdd is applied by a power source line 2, and the peripheral circuits 31 and 32 operate at the power supply voltage Vdd. On the other hand, for the memory cell array 30, an output line which outputs the voltage Vddm boosted from the power supply voltage Vdd supplied from the power source line 2 by a boost circuit 21 is used as the memory array power supply line 4. This enables the implementation of the configuration whereby the power supply voltage Vddm higher than that for the peripheral circuits is applied to the memory cell array 30.

Figure 15:
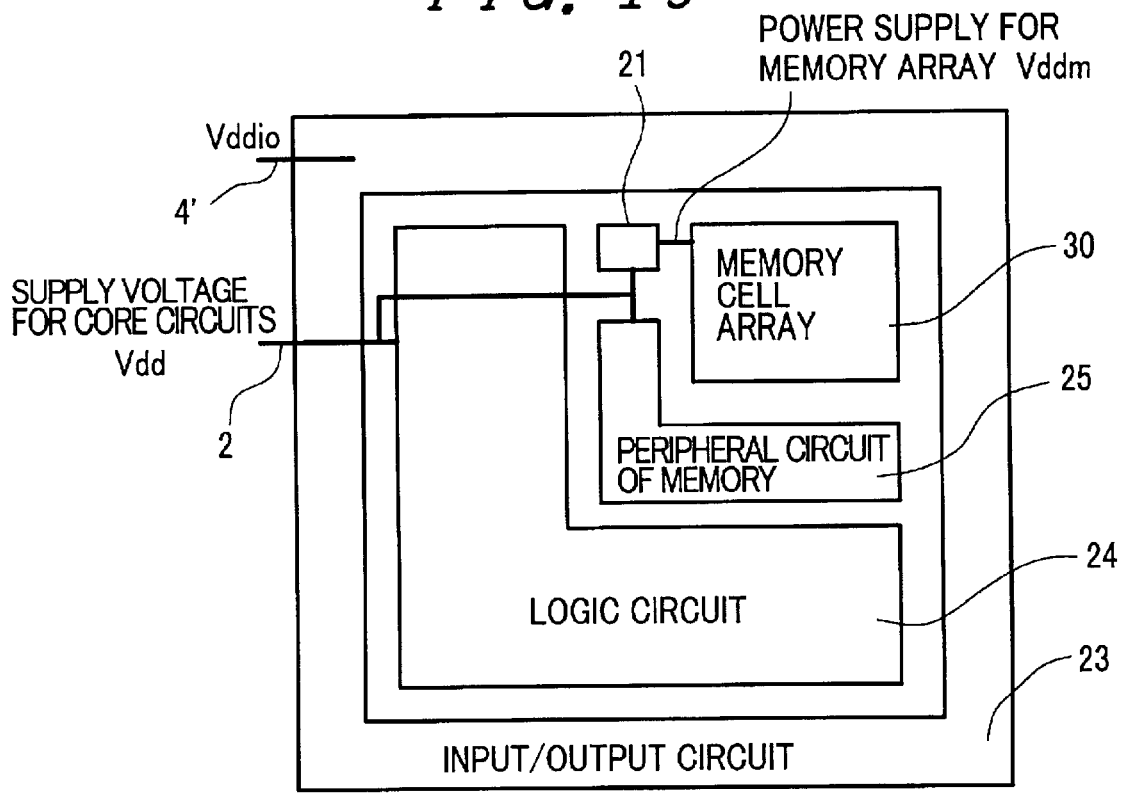
FIG. 15 is a block diagram showing the coupling of power supply wiring in the case where the power supply configuration of FIG. 13 is applied to a system LSI.

FIG. 15 is a schematic diagram showing the coupling of power supply wiring in the case where such a power supply configuration has been applied to a system LSI. FIG. 15 shows the power supply configuration of the system LSI including a memory circuit composed of a peripheral circuit of memory 25 and the memory cell array 30, an input/output circuit 23, and a logic circuit 24. To the system LSI in the diagram, a power supply voltage Vdd for core circuits for operating the logic circuit 24, and a higher voltage power supply voltage Vddio for the input/output circuit (IO) for operating the input/output circuit 23 are supplied.

A reference numeral 21 in the diagram denotes a boost circuit. To the peripheral circuit of memory 25, a power supply voltage Vdd for core circuits used for the logic circuit is supplied. To the memory cell array 30, the power supply voltage Vddm boosted higher than the voltage Vdd by using the boost circuit 21 is supplied.

(Embodiment 9)

Figure 14:
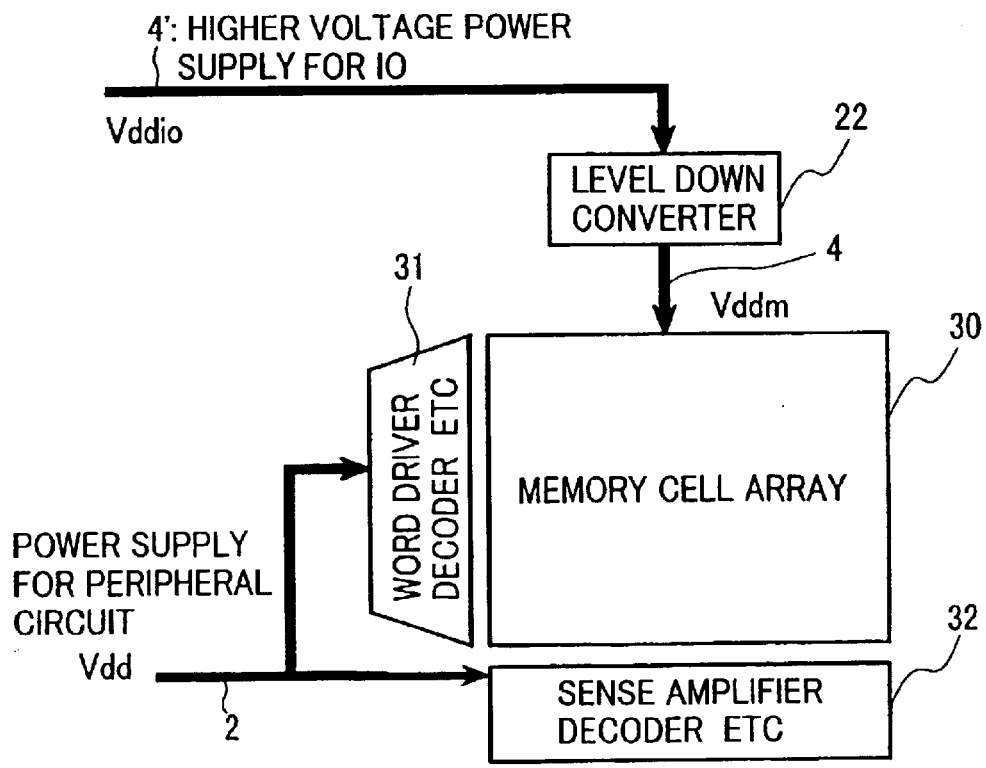
FIG. 14 is a block diagram showing a memory cell array and peripheral circuits, and a configuration of power supply to be supplied thereto in Embodiment 9.

FIG. 14 is a diagram showing another example of the coupling configuration of power supply lines for a memory circuit composed of a combination of the memory cell array 30, the peripheral circuit 31 including a word driver, a decoder, and the like, and the peripheral circuit 32 including a sense amplifier, a decoder, and the like.

To this memory circuit, a power supply voltage Vdd is supplied through the power source line 2 for operating the peripheral circuits 31 and 32 of memory, and a higher voltage power supply voltage Vddio for IO higher than the voltage Vdd used for the input/output circuit of the LSI, and the like of the LSI is supplied through a power supply line 4'. The peripheral circuits 31 and 32 operate at a power source voltage Vdd. On the other hand, for the memory cell array 30, an output line which outputs the voltage Vddm stepped down from the power supply voltage Vddio supplied from the power source line 4' by a level down converter 22 is used as the memory array power supply line 4. This enables the implementation of the configuration whereby the power supply voltage Vddm higher than that for the peripheral circuits is applied to the memory cell array 30.

Figure 16:
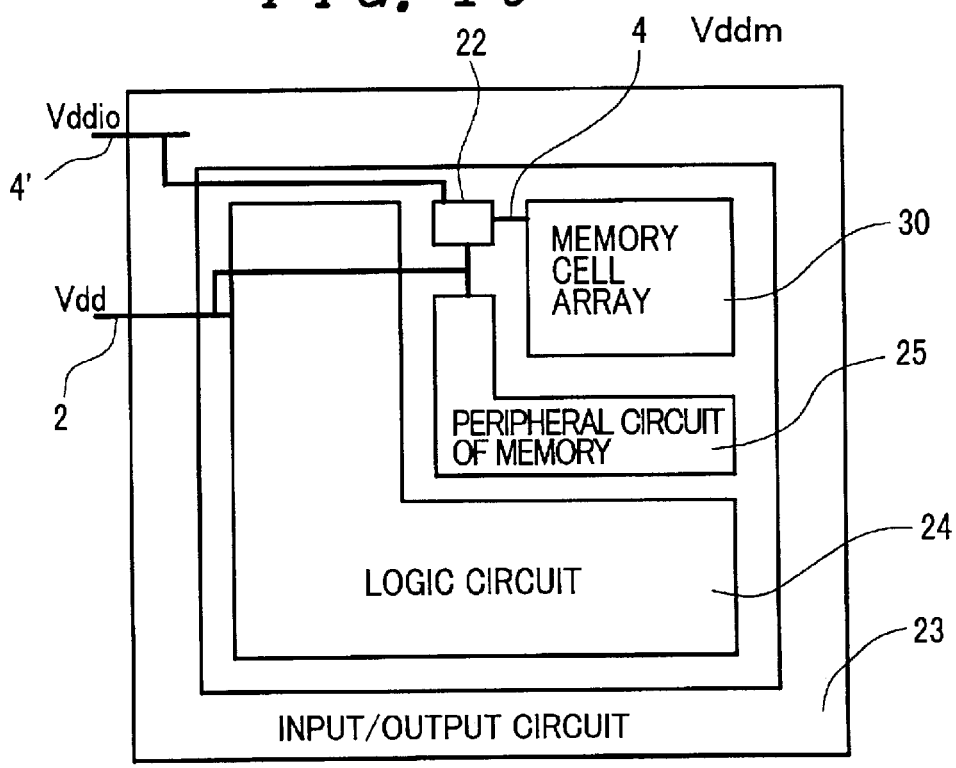
FIG. 16 is a block diagram showing the coupling of power supply wiring in the case where the power supply configuration of FIG. 14 is applied to a system LSI.

FIG. 16 shows the coupling of power supply wiring on a chip in the case where such a power supply configuration has been applied to a system LSI. FIG. 16 shows the power supply configuration of the system LSI including an input/output circuit, a logic circuit, and a memory circuit. To the system LSI in the diagram, a power supply voltage Vdd for core circuits for operating a logic circuit 24, and a higher voltage power supply voltage Vddio for IO for operating an input/output circuit 23 are supplied.

A reference numeral 22 in the diagram denotes a level down converter. To the peripheral circuit of memory 25, a power supply voltage Vdd for core circuits used for the logic circuit is supplied. To the memory cell array 30, the power supply voltage Vddm lower than the higher voltage power supply voltage Vddio for IO and higher than the power supply voltage Vdd for core circuits are supplied by using the level down converter 22.

(Embodiment 10)

In this embodiment, a description will be given to examples A to F of the voltage application pattern of the power supply voltage to be applied to the SRAM memory cell during a period in which the SRAM circuit is being operated (during an active state) and during a period in which it is not being operated (during a non-active state).

Figure 17:
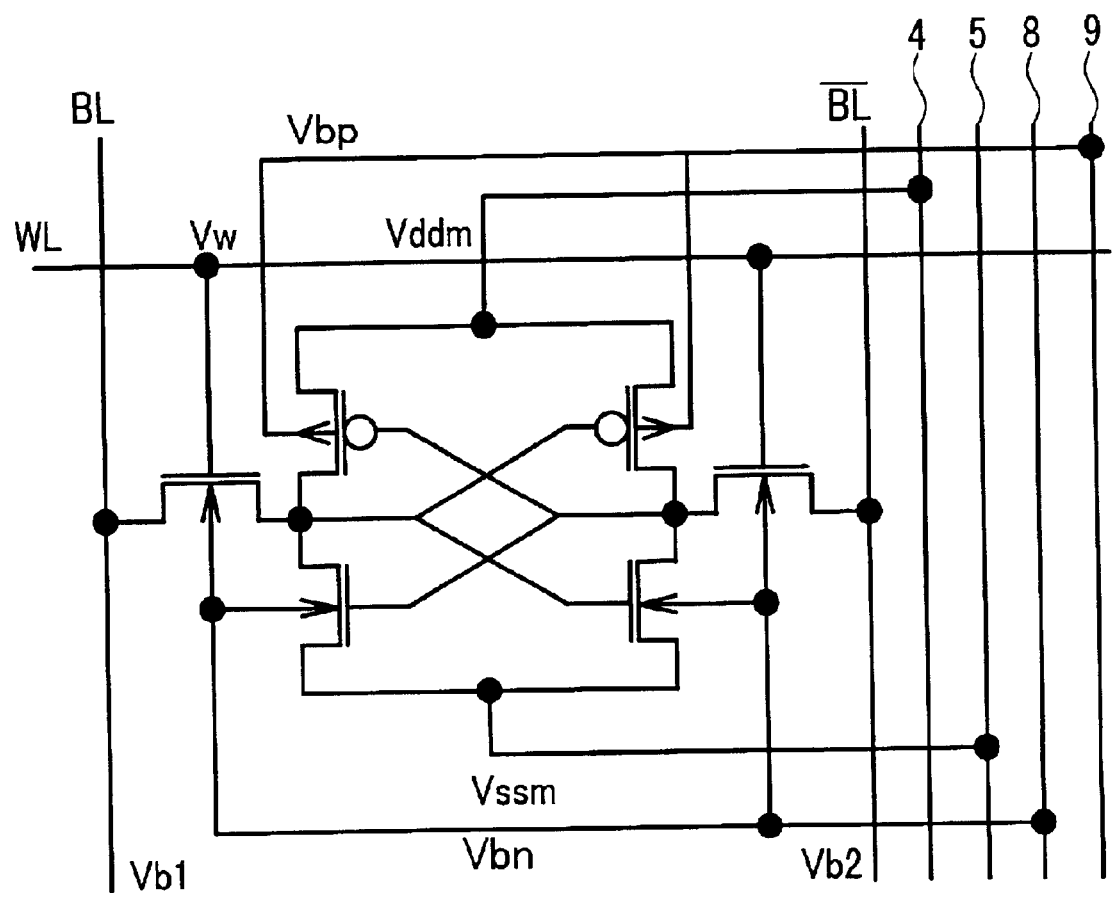
FIG. 17 is a circuit diagram of a SRAM memory cell configured such that it is possible to apply the well potentials of MOS transistors constituting the SRAM memory cell shown in FIG. 2 through well power supply lines.

FIG. 17 is a circuit diagram of a SRAM memory cell configured such that each well electric potential of the MOS transistors constituting the SRAM memory cell shown in FIG. 2 can be applied through a well power supply line 8 or 9. As shown in FIG. 17, the P-well power supply line 8 is coupled to the P-well in the memory cell in which the NMOS transistors are formed, and the N-well power supply line 9 is coupled to the N-well in the memory cell in which the PMOS transistors are formed. Whereas, a reference character Vbn denotes the voltage of the P-well power supply line 8, and Vbp denotes the voltage of the N-well power supply line 9.

(1) POWER SUPPLY VOLTAGE APPLICATION PATTERN EXAMPLE A

FIGS. 18A and 18B are diagrams respectively showing the voltages to be applied to the SRAM memory cells during the active state and during the non-active state of the SRAM circuit. FIG. 18A shows the power supply voltage Vddm for memory cells and the voltage Vbp of the N-well power supply line. Whereas, FIG. 18B shows the ground voltage Vssm for memory cells and the voltage Vbn of the P-well power supply line 8.

In this power supply voltage application pattern example, during the active state, the voltage Vdd' higher than the power supply voltage Vdd for the peripheral circuits is applied as the power supply voltage Vddm for memory cells and the voltage Vbp of the N-well power supply line. During the non-active state, the voltage Vdd equal to the power supply voltage for the peripheral circuits is applied as both the voltages. As the ground voltage Vssm for memory cells and the voltage Vbn of the P-well power supply line, the constant ground voltage Vss is applied at all times irrespective of during the active state or during the non-active state. With such a power supply voltage application pattern, it is possible to suppress the leak current during the non-active state.

(2) POWER SUPPLY VOLTAGE APPLICATION PATTERN EXAMPLE B

FIGS. 19A and 19B are diagrams respectively showing the voltages to be applied to the SRAM memory cells during the active state and during the non-active state of the SRAM circuit. FIG. 19A shows the power supply voltage Vddm for memory cells and the voltage Vbp of the N-well power supply line. Whereas, FIG. 19B shows the ground voltage Vssm for memory cells and the voltage Vbn of the P-well power supply line.

In this power supply voltage application pattern example, as with FIG. 18A, during the active state, the voltage Vdd' higher than the power supply voltage Vdd for the peripheral circuits is applied as both the power supply voltage Vddm for memory cells and the voltage Vbp of the N-well power supply line. However, during the non-active state, as distinct from FIG. 18A, a voltage lower than the power supply voltage Vdd for the peripheral circuits to a degree capable of holding the data in the memory cells is applied as both the voltages. Also with such a power supply voltage application pattern, it is possible to suppress the leak current during the non-active state.

(3) POWER SUPPLY VOLTAGE APPLICATION PATTERN EXAMPLE C

FIGS. 20A to 20D are diagrams respectively showing the voltages to be applied to the SRAM memory cells during the active state and during the non-active state of the SRAM circuit. FIG. 20A shows the power supply voltage Vddm for memory cells; FIG. 20B shows the ground voltage Vssm for memory cells; FIG. 20C shows the voltage Vbp of the N-well power supply line; and FIG. 20D shows the voltage Vbn of the P-well power supply line.

Incidentally, also in FIGS. 21A to 21D, FIGS. 22A to 22D, and FIGS. 23A to 23D, shown later, the same voltages as those in FIGS. 20A to 20D are shown, respectively.

In this power supply voltage application pattern example, as the power supply voltage Vddm for memory cells, during the active state, the voltage Vdd' higher than the power supply voltage Vdd for the peripheral circuits is applied. During the non-active state, the voltage Vdd equal to the power supply voltage for the peripheral circuits is applied.

As the ground voltage Vssm for memory cells, the constant Vss is applied at all times irrespective of during the active state or during the non-active state.

As the voltage Vpb of the N-well power supply line for providing a substrate bias of the PMOS transistor, the voltage Vdd' applied to the source electrode of each PMOS transistor is applied during the active state, and a voltage higher than the voltage Vdd' applied to the source electrode of each PMOS transistor is applied during the non-active state.

As the voltage Vbn of the P-well power supply line for providing a substrate bias of the NMOS transistor, the voltage Vss applied to the source electrode of each NMOS transistor is applied during the active state, and a voltage lower than the voltage Vss applied to the source electrode of each NMOS transistor is applied during the non-active state.

Also with such a power supply voltage application pattern, it is possible to suppress the leak current during the non-active state.

(4) POWER SUPPLY VOLTAGE APPLICATION PATTERN EXAMPLE D

In FIGS. 21A to 21D, the different pattern from the power supply voltage application pattern example of FIGS. 20A to 20D described above is the applied voltage pattern of the power supply voltage Vddm for memory cells. As shown in FIG. 21A, it is identical with the voltage application pattern example shown in FIG. 20A in that the voltage Vdd' higher than the power supply voltage Vdd for the peripheral circuits is applied as the power supply voltage Vddm for memory cells during the active state. However, it is different from the voltage application pattern example shown in FIG. 20A in that a voltage lower than the power supply voltage Vdd for the peripheral circuits is applied during the non-active state.

Also with such a power supply voltage application pattern, it is possible to suppress the leak current during the non-active state.

(5) POWER SUPPLY VOLTAGE APPLICATION PATTERN EXAMPLE E

Figure 22A:
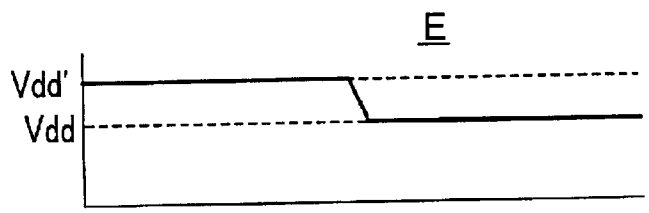
FIGS. 22A to 22D are diagrams showing a power supply voltage application pattern example E during the active state and during the non-active state of the voltages to be applied to the memory cell in Embodiment 10.
Figure 22B:
Figure 22C:
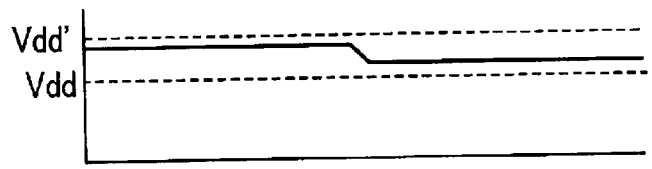

In FIGS. 22A to 22D, the different pattern from the power supply voltage application pattern example of FIGS. 20A to 20D described above is the applied voltage pattern of the voltages Vbp and Vbn of the P-well power supply line. As shown in FIG. 22C, as the voltage Vpb of the N-well power supply line 9 for providing a substrate bias of the PMOS transistor, a voltage lower than the voltage Vdd' applied to the source electrode of each PMOS transistor is applied during the active state, and a voltage higher than the voltage Vdd applied to the source electrode of each PMOS transistor is applied during the non-active state.

Figure 22D:
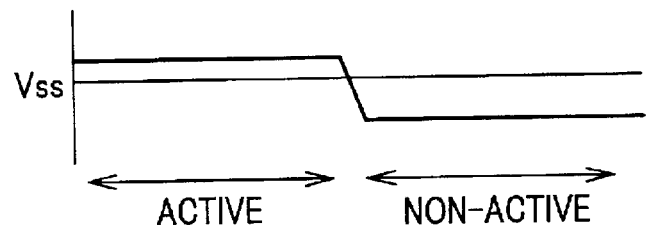

As shown in FIG. 22D, as the voltage Vbn of the P-well power supply line 8 for providing a substrate bias of the NMOS transistor, a voltage higher than the voltage Vss applied to the source electrode of each NMOS transistor is applied during the active state, and a voltage lower than the voltage Vss applied to the source electrode of each NMOS transistor is applied during the non-active state.

With such a power supply voltage application pattern, it is possible to reduce the threshold voltage of each MOS transistor during the active state, thereby increasing the current, as well as to suppress the leak current during the non-active state.

(6) POWER SUPPLY VOLTAGE APPLICATION PATTERN EXAMPLE F

In FIGS. 23A to 23D, the different pattern from the power supply voltage application pattern example of FIGS. 20A to 20D described above is the applied voltage patterns of the power supply voltage Vddm for memory cells and the voltage Vbp of the N-well power supply line.

Figure 23A:
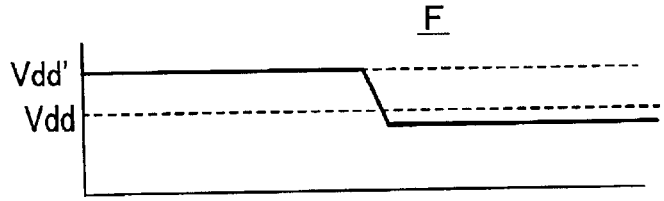
FIGS. 23A to 23D are diagrams showing a power supply voltage application pattern example F during the active state and during the non-active state of the voltages to be applied to the memory cell in Embodiment 10.
Figure 23B:

Namely, as shown in FIG. 23A, as the power supply voltage Vddm for memory cells, the voltage Vdd' higher than the power supply voltage Vdd for the peripheral circuits is applied during the active state. Where as, a voltage lower than the power supply voltage Vdd for the peripheral circuits is applied during the non-active state.

Figure 23C:
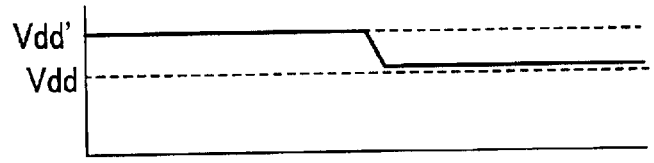
Figure 23D:
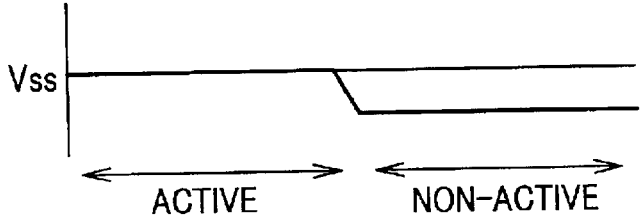
Figure 24A:
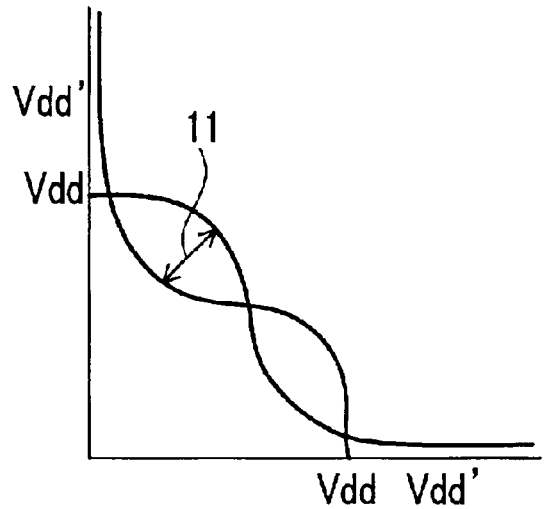
FIGS. 24A to 24C are diagrams each showing the relationship of the static noise margin between memory cells of the prior-art example and the present invention.
Figure 24B:
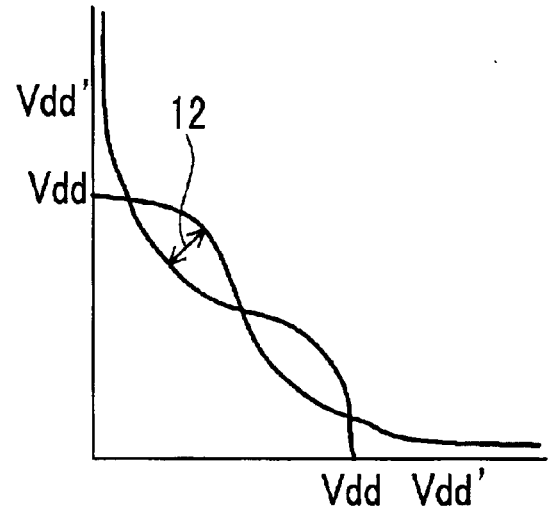
Figure 24C:
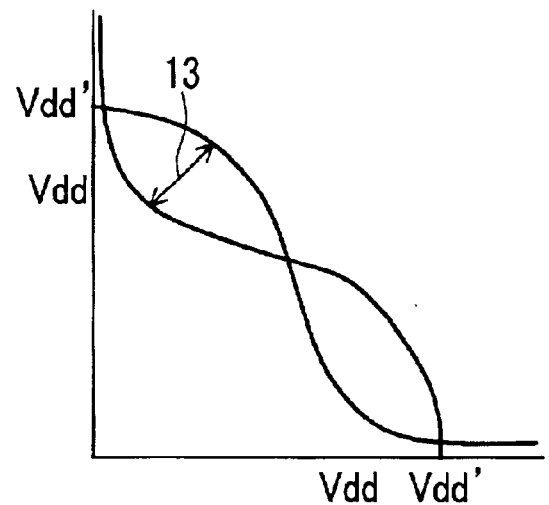

Further, as shown in FIG. 23C, as the voltage Vpb of the N-well power supply line 9 for providing a substrate bias of the PMOS transistor, during the active state, the voltage Vdd' applied to the source electrode of each PMOS transistor is applied, and during the non-active state, a voltage lower than the voltage Vdd' applied to the source electrode of each PMOS transistor and higher than the voltage Vddm during the non-active state is applied. To a substrate electrode of each NMOS, during the active state, a voltage higher than the voltage Vss applied to the source electrode of each NMOS is applied, and during the non-active state, a voltage lower than the voltage Vss applied to the source electrode of each NMOS is applied.

With such a power supply voltage application pattern, it is possible to reduce the threshold voltage of each MOS transistor during the active state, thereby increasing the current, as well as to suppress the leak current during the non-active state.

As apparent from respective embodiments described above, in accordance with the present invention, it is possible to implement a SRAM which has secured the static noise margin, features a low consumption power, and operates at a low voltage of not more than 1 V.

Up to this point, having described the present invention as related to the preferred embodiments, it is needless to say that the invention is not limited to the embodiments, and that various changes and modifications may be made without departing from the spirit or scope of the invention.

What is claimed is:

1. A semiconductor memory device, comprising:
    a plurality of static memory cells each comprising N-channel first and second driver MOS transistors, N-channel first and second transfer MOS transistors, and P-channel first and second load MOS transistors, and being placed in an array on a semiconductor substrate,
    wherein source electrodes of the driver MOS transistors are coupled to a first operating potential node, and source electrodes of the first and second load MOS transistors are coupled to a second operating potential node,
    wherein during a write operation, a potential difference between the first operating potential node and the second operating potential node is larger than a high-level potential applied to gate electrodes of the first and second transfer MOS transistors,
    wherein the first driver MOS transistor and the first transfer MOS transistor are formed in a first P-well region,
    wherein the second driver MOS transistor and the second transfer MOS transistor are formed in a second P-well region,
    wherein the first and second P-channel load MOS transistors are formed in a first N-well region, which is between the first and second P-well regions,
    wherein a center line of diffusion layers of the first driver MOS transistor and the first transfer MOS transistor is parallel to a boundary between the first P-well region and said first N-well region
    outer shapes of said diffusion layers are linearly symmetric against the center line, and
    the gate width size of the N-channel driver MOS transistors is not more than 1.4 times the gate width size of the N-channel type transfer MOS transistors.

2. The semiconductor memory device according to claim 1, wherein the threshold voltages of the P-channel MOS transistors are set to be of higher absolute value than the threshold voltages of the N-channel MOS transistors.

3. The semiconductor memory device according to claim 1, wherein a first polysilicon layer used for the gate electrode of the first transfer MOS transistor and a second polysilicon layer used for the gate of the first driver MOS transistor and the gate of the first load MOS transistor are disposed in parallel relation to each other, and a third polysilicon layer used for the gate electrode of the second transfer MOS transistor and a fourth polysilicon layer used for the gate of the second driver MOS transistor and the gate of the second load MOS transistor are disposed in parallel relation to each other.

4. The semiconductor memory device according to claim 3, wherein the potential difference between the first operating potential node and the second operating potential node during the period in which the memory cells are not operating is set to be smaller than the potential difference between the first operating potential node and the second operating potential node during the period in which the memory cells are operating.

5. The semiconductor memory device according to claim 3, wherein the potential of first and second P-well regions during a period in which the memory cells are not operating is set to be smaller than the potential of the first operating potential node.

6. The semiconductor memory device according to claim 3, wherein a potential of said N-well region during a period in which the memory cells are not operating is set to be larger than the potential of the second operating potential node.

7. The semiconductor memory device according to claim 3, wherein the potential of said first and second P-well regions during a period in which the memory cells are operating is set to be larger than the potential of the first operating potential node.

8. The semiconductor memory device according to claim 3, wherein the potential of said N-well region during a period in which the memory cells are operating is set to be smaller than the potential of the second operating potential node.

9. The semiconductor memory device according to claim 1,
wherein said potential differences between the first operating potential node and the second operating potential node have the same value for both read operation and write operation.

10. A semiconductor memory device, comprising:
a plurality of static memory cells each comprising N-channel first and second driver MOS transistors, N-channel first and second transfer MOS transistors, and P-channel first and second load MOS transistors, and placed in an array on a semiconductor substrate,
wherein source electrodes of the drive MOS transistors are coupled to a first operating potential node, and source electrodes of the first and second load MOS transistors are coupled to a second operating potential node,
wherein during read and write operations a potential difference between the first operating potential node and the second operating potential node is larger than a high-level potential applied to gate electrodes of the first and second transfer MOS transistors, and
wherein said potential difference between the first operating potential node and the second operating potential node during write operation is larger than potential difference between the first operating potential node and the second operating potential node during standby mode.

11. The semiconductor memory device according to claim 10,
wherein threshold voltages of the P-channel MOS transistors are set to be of higher absolute value than the threshold voltages of the N-channel MOS transistors.

12. The semiconductor memory device according to claim 11,
wherein the first driver MOS transistor and the first transfer MOS transistor are formed in a first P-well region,
wherein the second driver MOS transistor and the second transfer MOS transistor are formed in a second P-well region,
wherein the first and second P-channel load MOS transistors are formed in a first N-well region, which is placed between said first and second P-well regions, and
wherein the gate width size of the N-channel driver MOS transistors is not more than 1.4 times the gate width size of the N-channel transfer MOS transistors.

13. The semiconductor memory device according to claim 12,
wherein a first center line of diffusion layers of the first driver MOS transistor and the first transfer MOS transistor is parallel to a boundary between the first P-well region and said first N-well region, and the outer shapes of said diffusion layers of the first driver MOS transistor and the first transfer MOS transistor are linearly symmetric against the first center line, and
wherein a second center line of diffusion layers of the second driver MOS transistor and the second transfer MOS transistor is parallel to the boundary between the second P-well region and said first N-well region, and the outer shapes of said diffusion layers of second driver MOS transistor and the second transfer MOS transistor are linearly symmetric against the second center line.

* * * * *